US008119050B2

(12) United States Patent
Kuratomi et al.

(10) Patent No.: US 8,119,050 B2
(45) Date of Patent: Feb. 21, 2012

(54) METHOD OF MANUFACTURING A SEMICONDUCTOR DEVICE

(75) Inventors: Bunshi Kuratomi, Kodaira (JP); Takafumi Nishita, Iruma (JP); Youichi Kawata, Higashiyamato (JP)

(73) Assignee: Renesas Electronics Corporation, Kanagawa (JP)

( * ) Notice: Subject to any disclaimer, the term of this patent is extended or adjusted under 35 U.S.C. 154(b) by 1103 days.

(21) Appl. No.: 11/187,864

(22) Filed: Jul. 25, 2005

(65) Prior Publication Data

US 2006/0043641 A1 Mar. 2, 2006

(30) Foreign Application Priority Data

Aug. 31, 2004 (JP) ................................. 2004-252108

(51) Int. Cl.
*B29C 70/70* (2006.01)
(52) U.S. Cl. ......... 264/272.17; 264/272.11; 264/272.13; 264/272.15
(58) Field of Classification Search ............. 264/272.17, 264/272.11, 272.13, 272.15
See application file for complete search history.

(56) References Cited

U.S. PATENT DOCUMENTS

| | | | | |
|---|---|---|---|---|
| 5,340,528 A | * | 8/1994 | Machida et al. | 264/328.7 |
| 5,447,888 A | * | 9/1995 | Takashima et al. | 29/827 |
| 5,562,979 A | * | 10/1996 | Easterlow et al. | 428/327 |
| 6,309,916 B1 | * | 10/2001 | Crowley et al. | 438/127 |
| 2002/0000674 A1 | * | 1/2002 | Saito et al. | 257/787 |
| 2003/0052394 A1 | * | 3/2003 | Aga et al. | 257/678 |
| 2003/0178708 A1 | * | 9/2003 | Minamio et al. | 257/666 |
| 2004/0097632 A1 | * | 5/2004 | Akizuki et al. | 524/492 |

FOREIGN PATENT DOCUMENTS

JP 5-243302 9/1993
JP 2000306933 A * 11/2000

OTHER PUBLICATIONS

Machine translation of JP 05-243302.*
Engliish abtract of JP2000-306933.*

* cited by examiner

*Primary Examiner* — Christina Johnson
*Assistant Examiner* — Xue Liu
(74) *Attorney, Agent, or Firm* — Antonelli, Terry, Stout & Kraus, LLP.

(57) ABSTRACT

Improvement in the yield of a semiconductor device is aimed at. When extruding a molded body with the ejector pin which performs advance-or-retreat movement at the projecting portion which projects from this bottom face in the bottom face of a mold cavity corresponding to the surface and the mounting side of a molded body after forming a molded body, depressed portions being formed in the surface and the mounting side by projecting portions, they can extrude. When accumulating molded bodies themselves in the baking step after a resin molding step and performing bake, by arranging the resin burr which furthermore withdrew from the surface and the mounting side in the depressed portion, bake can be performed in the condition that the accumulated molded bodies are stuck. Therefore, the form of deformation of a warp etc. of each molded body or a lead frame, can be made uniform, and, as a result, improvement in the yield of QFP (semiconductor device) is aimed at.

8 Claims, 13 Drawing Sheets

METHOD OF MANUFACTURING A SEMICONDUCTOR DEVICE

CROSS-REFERENCE TO RELATED APPLICATION

The present application claims priority from Japanese patent application No. 2004-252108 filed on Aug. 31, 2004, the content of which is hereby incorporated by reference into this application.

1. Field of the Invention

The present invention relates to a semiconductor manufacturing technology, and particularly relates to an effective technology in the application to improvement in the yield of the semiconductor device of a plastic molded type.

2. Description of the Background Art

With conventional electronic parts and a resin molding device, by locating so that a rising part may be formed in a mold cavity inner surface and it may become flush with a flat face at the withdrawing and incoming point about a pin at the rising part, even if a resin burr occurs in a sheath resin part, electronic parts can be mounted on a printed circuit board in the good condition (for example, refer to Patent Reference 1).

[Patent Reference 1] Japanese Unexamined Patent Publication No. Hei 5-243302 (FIG. 1)

SUMMARY OF THE INVENTION

In the assembly of the semiconductor device of a plastic molded type, mold release of a molded body from a resin-molding metal mold is performed by extruding in the resin molding step with the ejector pin for product extrusion formed in the resin-molding metal mold. In a resin-molding metal mold, the action of an ejector pin is also sliding operation with the inner wall of a hole part which guides the action of an ejector pin while being the advance or retreat moving operation to the mold cavity of a metal mold. Therefore, if the sliding operation by the ejector pin and an inner wall increases, an ejector pin, or the inner wall of a hole part will be worn out, and the clearance between this hole part and ejector pin will be formed more greatly. By this effect, the resin burr to that thickness direction is formed on the surface of a molded body which an ejector pin pushes and presses.

Although baking treatment for promoting cure of the resin of a molded body further was performed after the resin molding step, the present inventors found out especially that the problem about poor quality occurred under the effect of the resin burr in the baking step after a resin molding step in the thin semiconductor device.

First, in the baking step after a resin molding step, bake is performed for the frame (or substrate) in which the molded body was formed in the condition of having accumulated molded bodies and having stored on the rack for exclusive use. If the resin burr is formed on the surface of the molded body in that case, a clearance will be formed by the resin burr between the molded bodies which adjoin in up-and-down direction, without the piled-up molded bodies sticking. Since the length of the resin burr comes out scatteringly, the clearance also becomes uneven size for every semiconductor device. After a molding step, in order to promote cure of a molded body, bake is performed, but in this baking step, although a molded body and a frame are extended by thermal expansion, it changes by subsequent cooling and warp is formed. If bake is performed in the condition that the clearance of uneven size is formed in the perimeter of a molded body for every semiconductor device, the warp of a molded body or a frame will also differ for every semiconductor device, and will become uneven. As a result, the problem that the flatness of a molded body, or a frame (or substrate) worsens occurs.

If the resin burr is formed on the surface of the molded body, when molded bodies are piled up in a baking step, the problem that a blemish is formed in an adjoining molded body by the resin burr will arise.

Although it is also possible to remove a resin burr after a resin molding step, the time required by product completion in this case becomes long, and since the cost which removal takes occurs, that the cost of product becomes high poses a problem.

The configuration where the depression portion was formed only in the underside (mounting side) of the sheath resin part of electronic parts, and the resin burr has been arranged in these depression portions is indicated by, the Patent Reference 1 (Japanese Unexamined Patent Publication No. Hei 5-243302) for the purpose of enabling good mounting to a printed circuit board. That is, since it is the measures only for mounting to a printed circuit board, a depression portion is formed only in the underside of a sheath resin part, and the existence of the depression portion in the surface of the opposite side to the underside of a sheath resin part is not indicated at all.

Usually, the extrusion of the product by an ejector pin is performed to both sides of the underside (mounting side) and the surface of a sheath resin part, and with the configuration indicated by the Patent Reference 1, since the depression portion is not formed in the surface of a sheath resin part, it will be in the condition that the resin burr projected at a surface side.

Therefore, if the configuration indicated in the Patent Reference 1 is adopted, the sheath resin parts are accumulated by the baking step after the resin molding step which the present inventors examined and bake is performed, since an uneven clearance is formed in the surface side of a sheath resin part by a resin burr, the problem of aggravation of flatness or the blemish to a sheath resin part occurs.

The purpose of the present invention is to offer the semiconductor device which can aim at improvement in the yield, and its manufacturing method.

Other purposes of the present invention are to offer the semiconductor device which can attain reduction of a manufacturing cost, and its manufacturing method.

The above-described and the other objects and novel features of the present invention will become apparent from the description herein and accompanying drawings.

Of the inventions disclosed in the present application, typical ones will be summarized briefly as follows.

That is, the present invention comprises: a semiconductor chip; a molded body performing resin molding of the semiconductor chip; and a plurality of external terminals electrically connected with the semiconductor chip; wherein a depressed portion is formed in a surface which is an opposite side to a mounting side of the molded body, and a resin burr which withdrew from the surface is arranged in the depressed portion.

Next, the present invention comprises the steps of: arranging a thin plate member over which a semiconductor chip was mounted to a metal-mold surface of a resin-molding metal mold, and closing the resin-molding metal mold after that; filling up a mold cavity of the resin-molding metal mold with resin for moldings; and making a molded body release from the resin-molding metal mold by extruding the molded body by a pin performing advance-or-retreat movement at a projecting portion which projects from a bottom face in the bottom face of the mold cavity corresponding to a surface of an opposite side to a mounting side of the molded body after forming the molded body by curing the resin for moldings; wherein a depressed portion is formed in the surface of the molded body by the projecting portion in the step of making the molded body release from the mold, and a resin burr which withdrew from the surface is further arranged in the depressed portion.

Furthermore, the present invention comprises the steps of: arranging a thin plate member over which a semiconductor chip was mounted to a metal-mold surface of a resin-molding metal mold, and filling up a mold cavity of the resin-molding metal mold with resin for moldings after closing the resin-molding metal mold; making a molded body release from the resin-molding metal mold by extruding the molded body by a pin performing advance-or-retreat movement at a projecting portion which projects from a bottom face in the bottom face of the mold cavity after forming the molded body by curing the resin for moldings; and stacking in layers a plurality of the thin plate members with which the molded body was formed respectively with the molded bodies themselves piled up, and promoting cure of the molded body by performing baking treatment in the laminating condition; wherein a resin burr which withdrew from the molded body is arranged in a depressed portion of the molded body formed by the projecting portion in the step of making the molded body release from the mold; and the baking treatment is performed to a plurality of the molded bodies stacked in layers in the step of promoting cure of the molded body sticking the molded bodies themselves adjoining in a thickness direction, respectively.

Next, the present invention comprises the steps of: arranging a thin plate member over which a semiconductor chip was mounted to a metal-mold surface of a resin-molding metal mold, and closing the resin-molding metal mold after that; filling up a mold cavity of the resin-molding metal mold with resin for moldings; making a molded body release from the resin-molding metal mold by extruding the molded body by a pin performing advance-or-retreat movement at a projecting portion which projects from a bottom face in the bottom face of the mold cavity after forming a molded body by curing the resin for moldings; and removing a resin burr arranged in a depressed portion of the molded body formed by the projecting portion in the step of making the molded body release from the mold by a water jet method; wherein in the step of removing, some or all of the resin burr is removed.

Advantages achieved by some of the most typical aspects of the inventions disclosed in the present application will be briefly described below.

When extruding a molded body in the bottom face of a mold cavity corresponding to the surface of a molded body by the pin which performs advance-or-retreat movement at the projecting portion which projects from the bottom face after forming a molded body, forming a depressed portion by the projecting portion on the surface of a molded body, it can extrude. When accumulating molded bodies in the baking step after a resin molding step and performing bake by furthermore arranging the resin burr which withdrew from the surface in the depressed portion, bake can be performed in the condition that the accumulated molded bodies are stuck. And the form of deformation of a warp etc. of each molded body and a thin plate member, can be made uniform. Thereby, the defect by an uneven package warp can be reduced and, as a result, improvement in the yield of a semiconductor device can be aimed at.

DETAILED DESCRIPTION OF THE PREFERRED EMBODIMENTS

Figure 1:
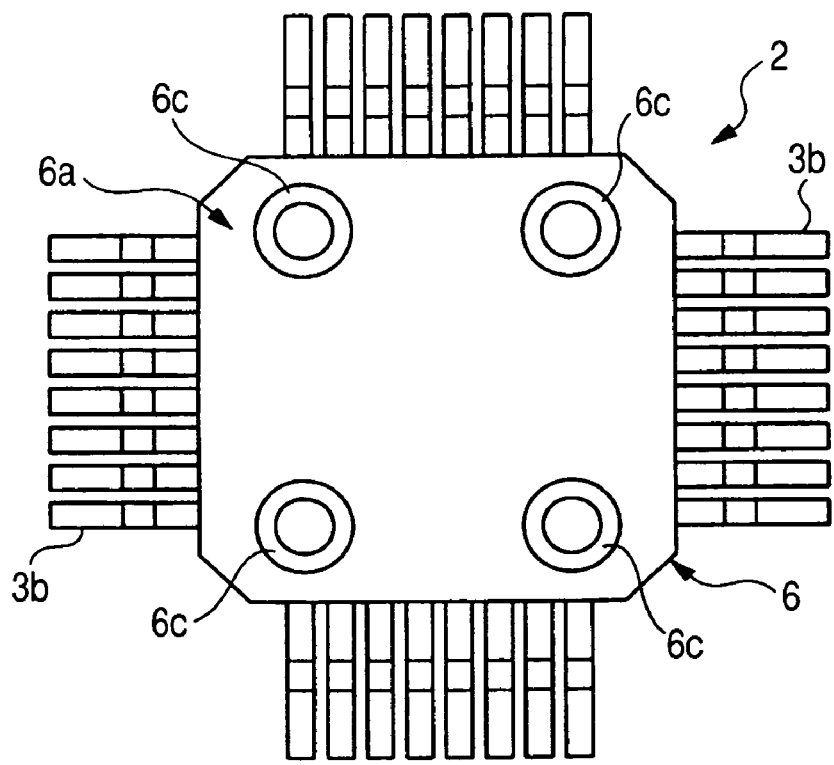
FIG. 1 is a plan view showing an example of the configuration of the semiconductor device of Embodiment of the invention.

In the following embodiment, except the time when especially required, explanation of the same or same part is not repeated in principle.

Furthermore, in the below-described embodiments, a description will be made after divided in plural sections or in plural embodiments if necessary for convenience's sake. These plural sections or embodiments are not independent each other, but in a relation such that one is a modification example, details or complementary description of a part or whole of the other one unless otherwise specifically indicated.

In the below-described embodiments, when a reference is made to the number of elements (including the number, value, amount and range), the number is not limited to a specific number but can be greater than or less than the specific number unless otherwise specifically indicated or principally apparent that the number is limited to the specific number.

Hereafter, an embodiment of the invention is explained in detail based on drawings. In all the drawings for describing the embodiment, like members of a function will be identified by like reference numerals and overlapping descriptions will be omitted.

Embodiment

Figure 2:
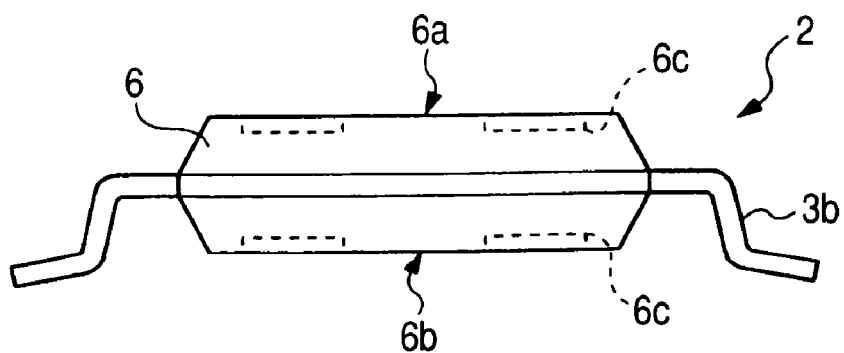
FIG. 2 is a side view showing an example of the configuration of the semiconductor device shown in FIG. 1.
Figure 3:
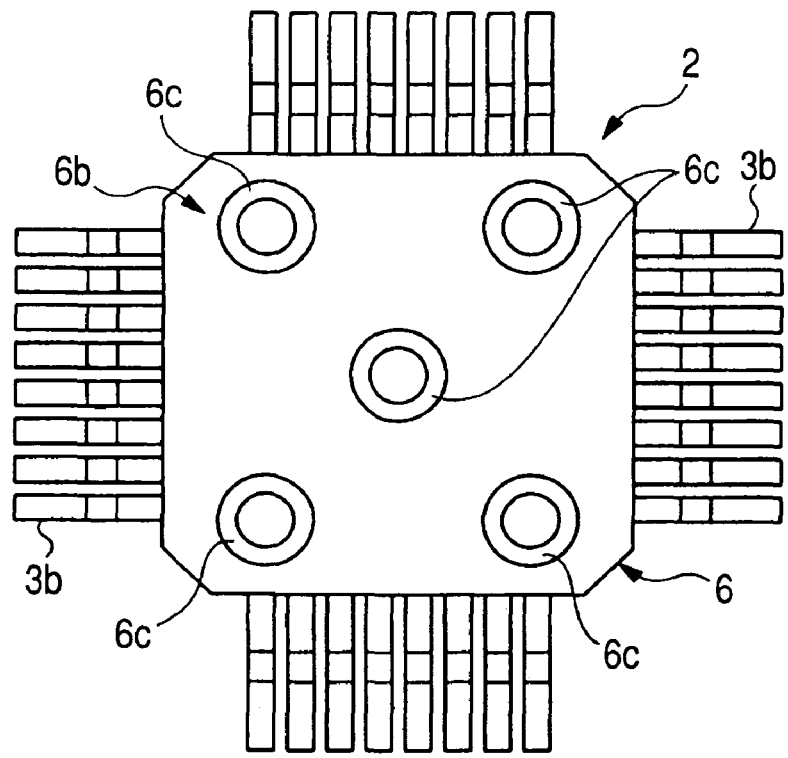
FIG. 3 is a back view showing an example of the configuration of the semiconductor device shown in FIG. 1.
Figure 4:
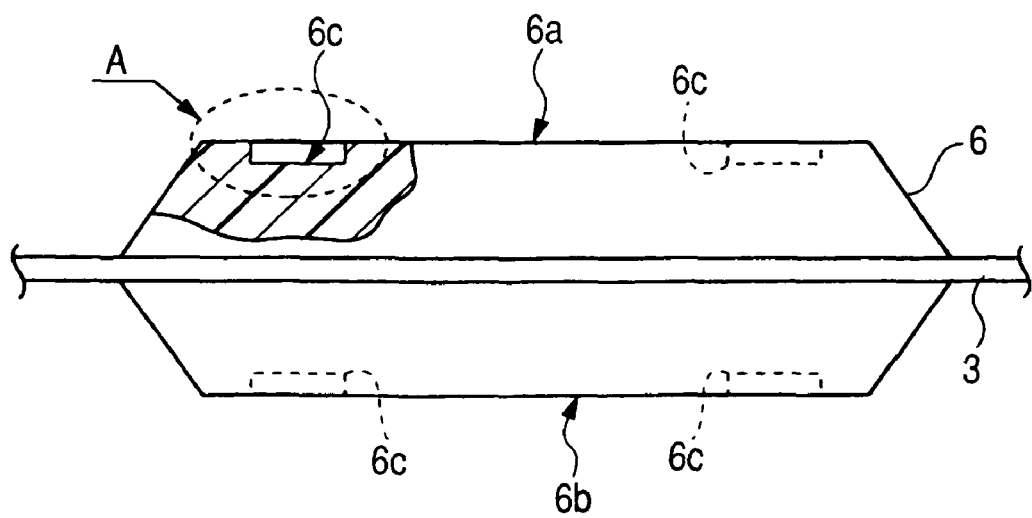
FIG. 4 is an enlarged partial side view fracturing the part of and showing the configuration of the semiconductor device shown in FIG. 1.
Figure 5:
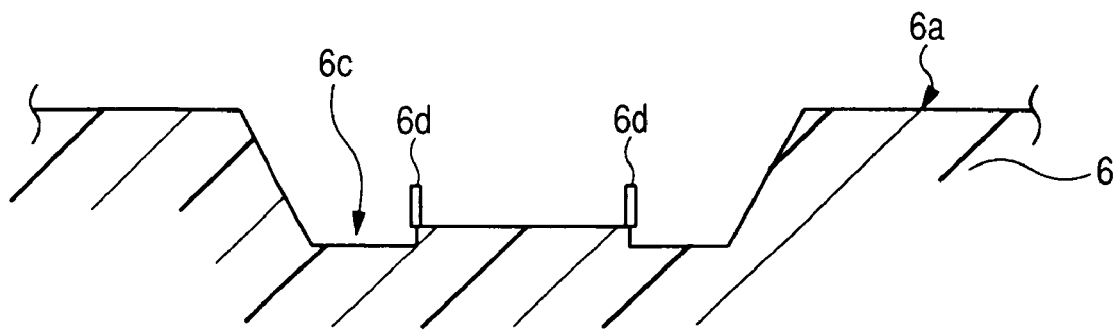
FIG. 5 is an enlarged partial sectional view showing the configuration of the A section of FIG. 4.
Figure 6:
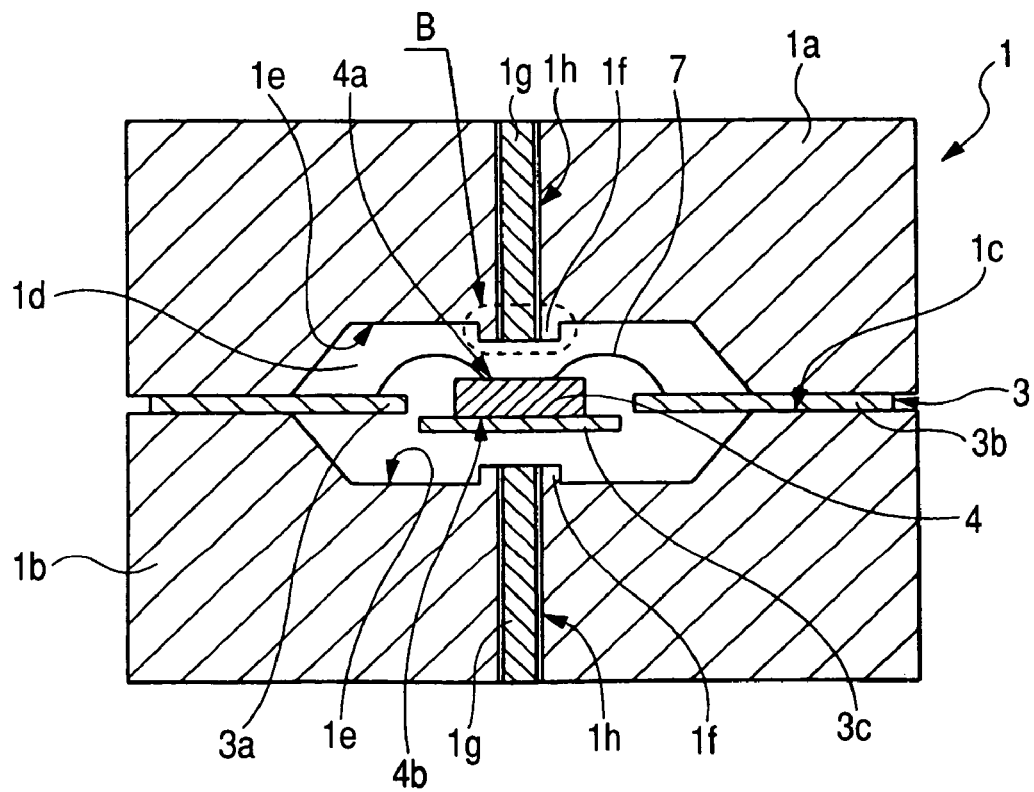
FIG. 6 is a sectional view showing an example of the configuration at the time of the metal-mold clamp in the resin molding step of the assembly of the semiconductor device shown in FIG. 1.
Figure 7:
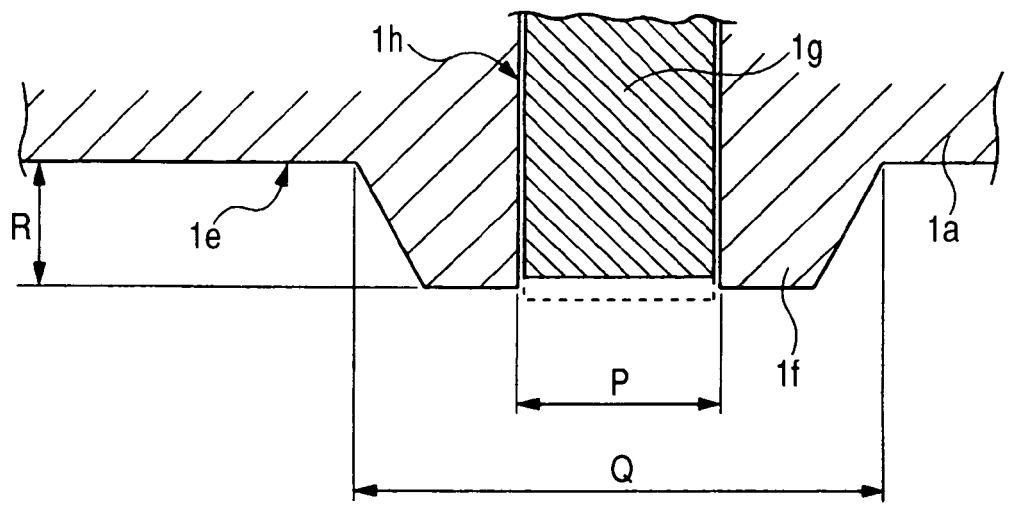
FIG. 7 is an enlarged partial sectional view showing the configuration of the B section of FIG. 6.
Figure 8:
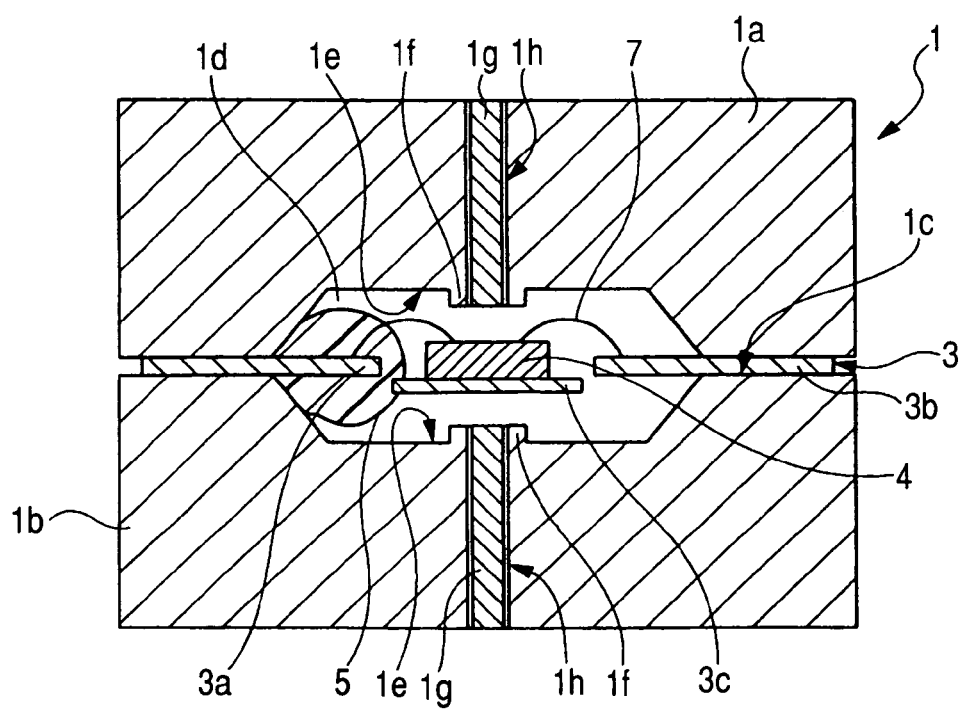
FIG. 8 is a sectional view showing an example of the configuration at the time of the resin injection in the resin molding step of the assembly of the semiconductor device shown in FIG. 1.
Figure 9:
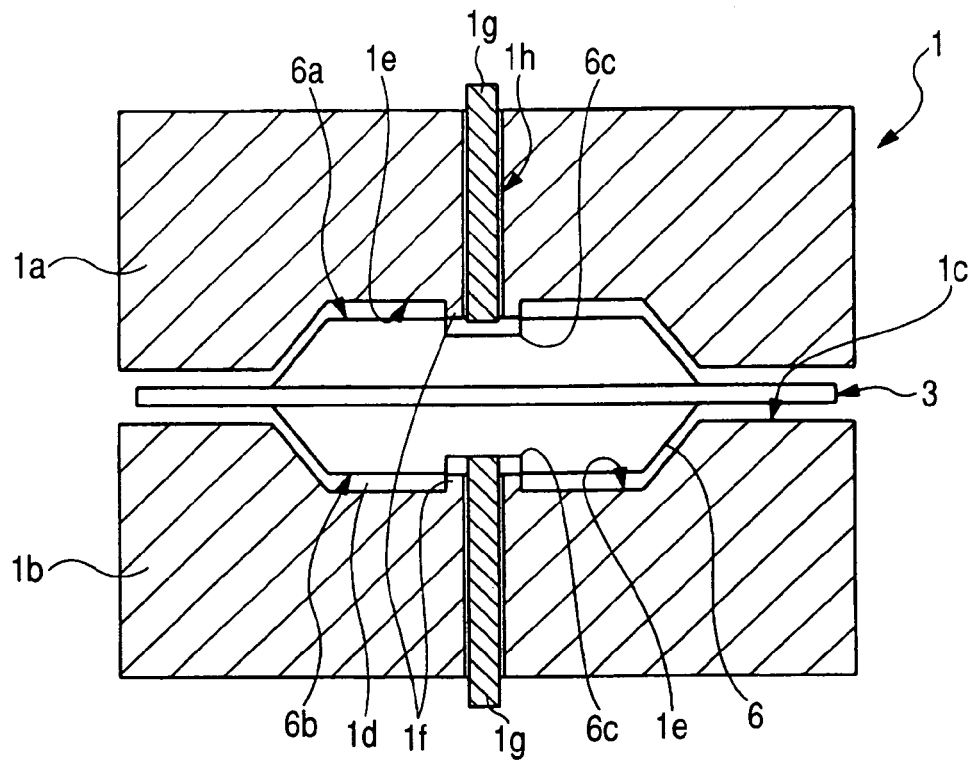
FIG. 9 is a sectional view showing an example of the configuration at the time of the product extrusion by an ejector pin in the resin molding step of the assembly of the semiconductor device shown in FIG. 1.
Figure 10:
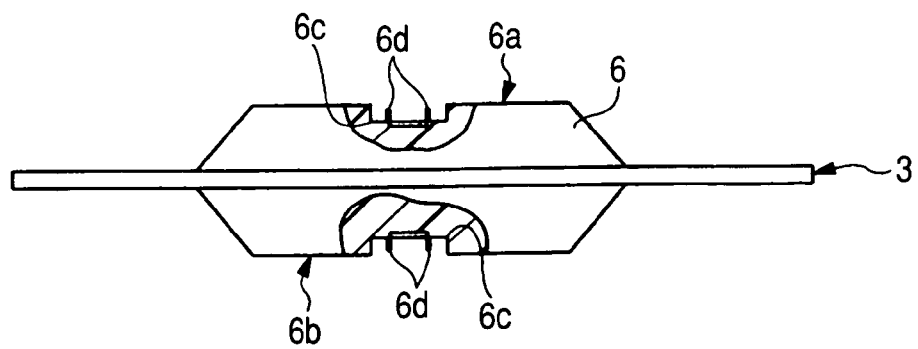
FIG. 10 is a partial side view fracturing the part of and showing the configuration of the semiconductor device which is shown in FIG. 9, and which was extruded with the ejector pin.
Figure 11:
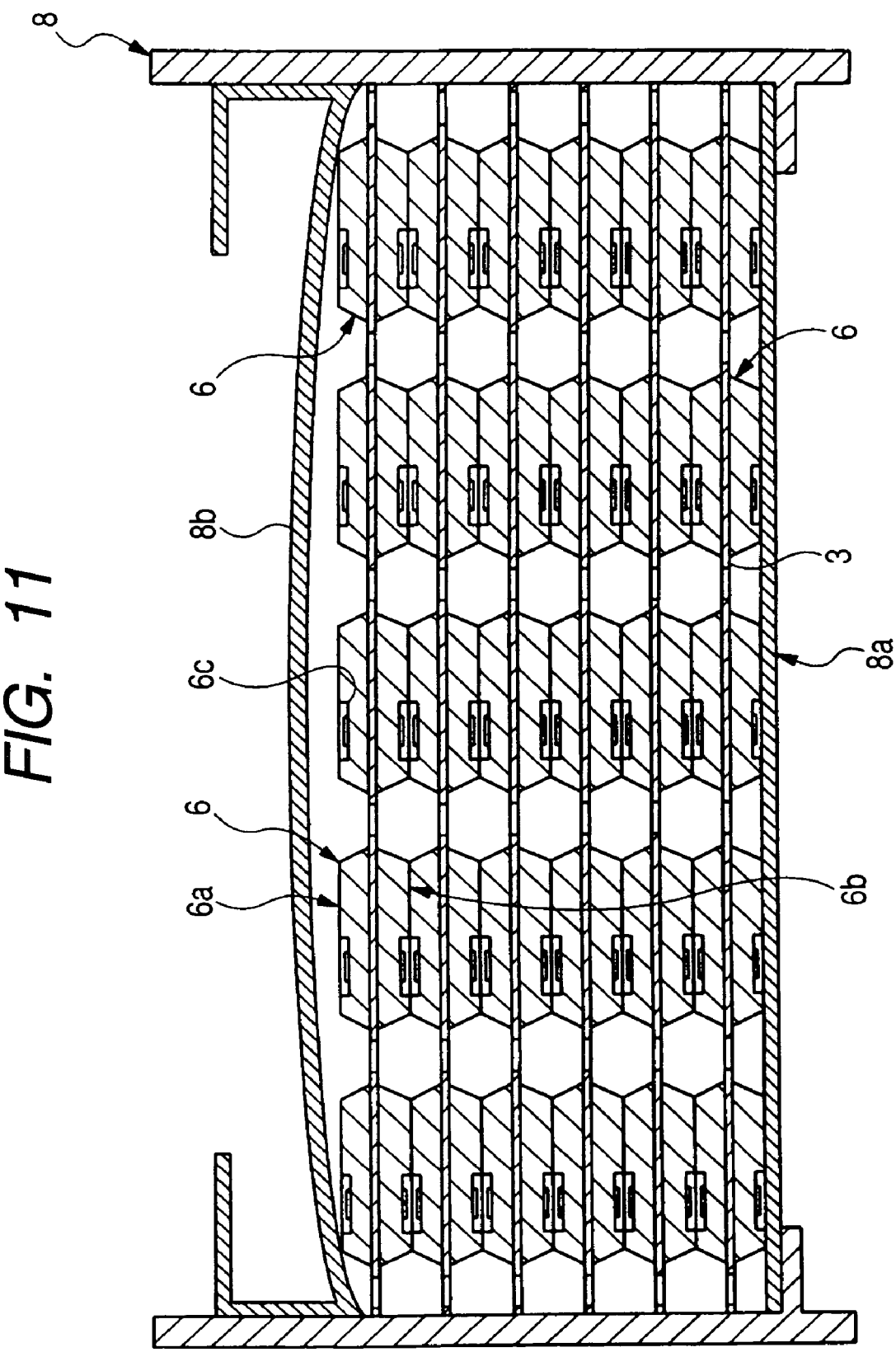
FIG. 11 is a sectional view showing an example of the configuration at the time of the baking treatment after resin molding in the assembly of the semiconductor device shown in FIG. 1.
Figure 12:
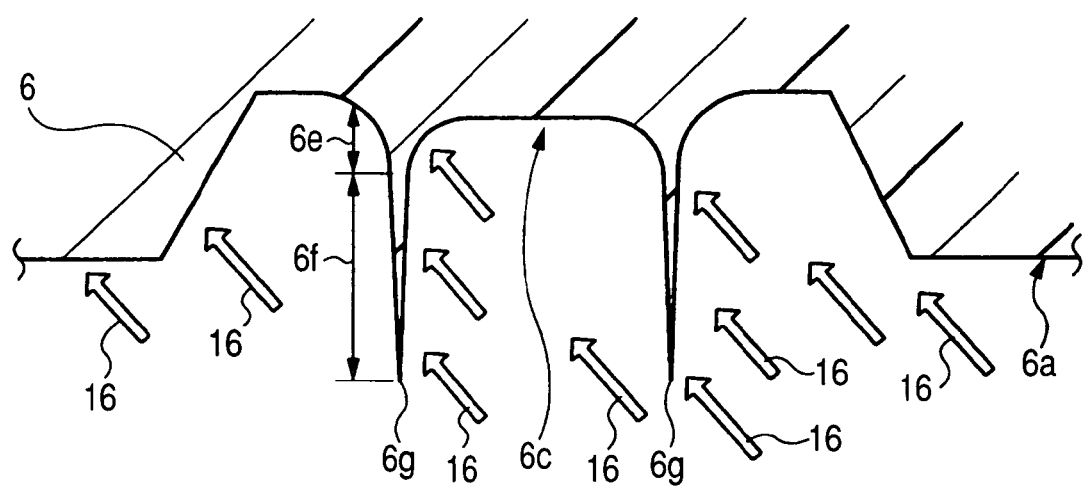
FIG. 12 is an enlarged partial sectional view showing the configuration at the time of the water jet in the assembly of the semiconductor device of the modification of Embodiment of the invention.
Figure 13:
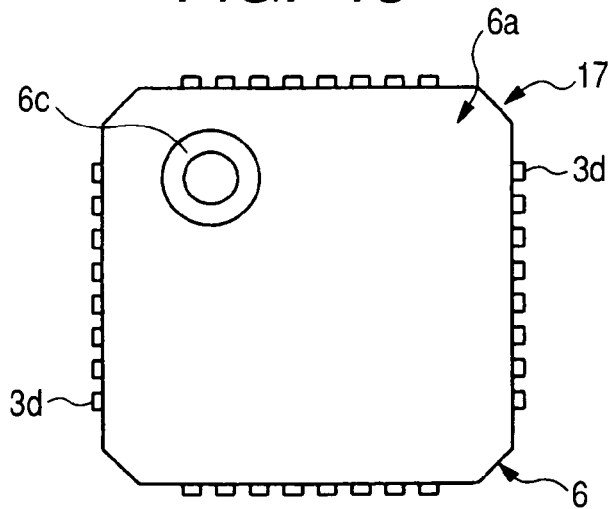
FIG. 13 is a plan view showing the configuration of QFN which is a semiconductor device of the modification of Embodiment of the invention.
Figure 14:
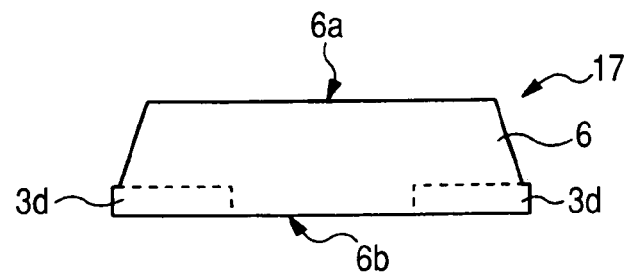
FIG. 14 is a side view showing an example of the configuration of QFN shown in FIG. 13.
Figure 15:
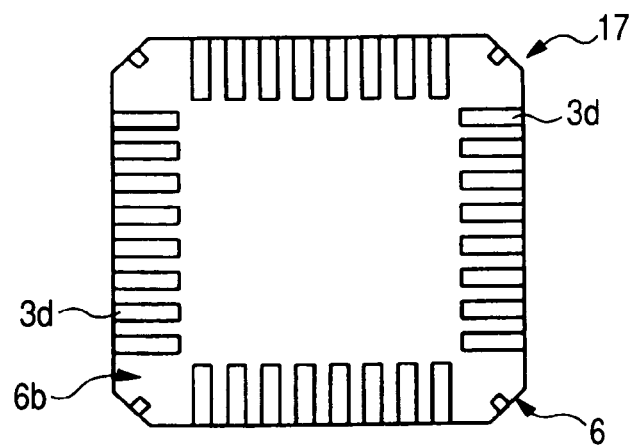
FIG. 15 is a back view showing an example of the configuration of QFN shown in FIG. 13.
Figure 16:
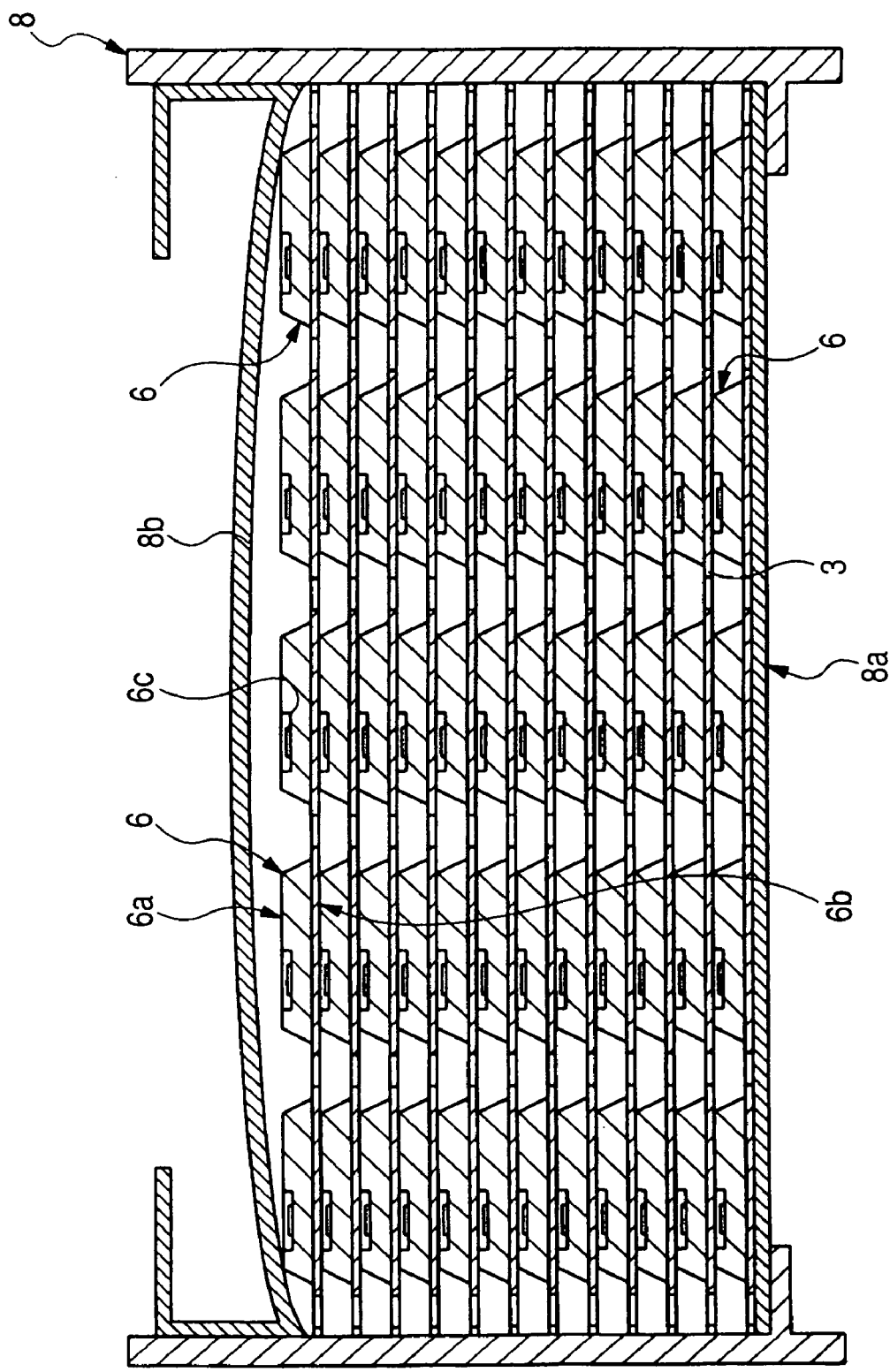
FIG. 16 is a sectional view showing an example of the configuration at the time of the baking treatment after the resin molding in the assembly of QFN shown in FIG. 13.
Figure 17:
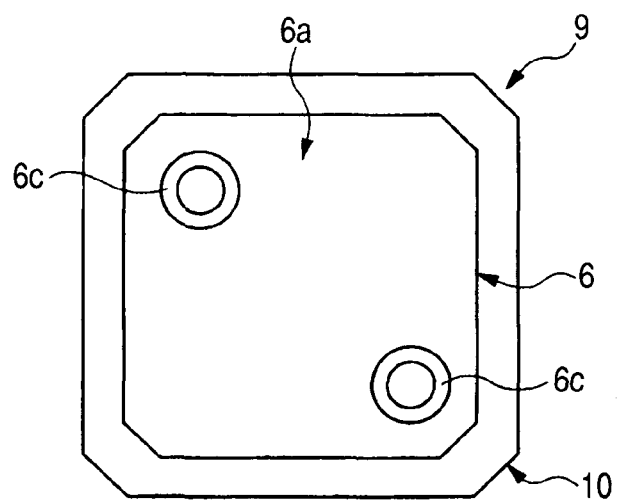
FIG. 17 is a plan view showing the configuration of BGA which is a semiconductor device of the modification of Embodiment of the invention.
Figure 18:
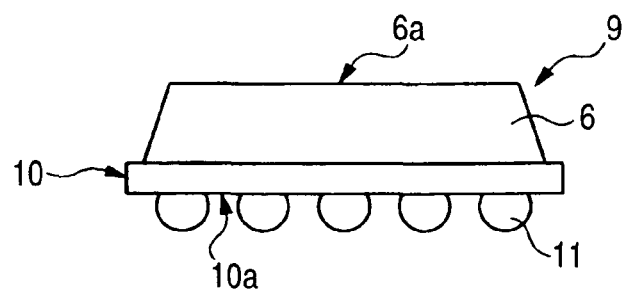
FIG. 18 is a side view showing an example of the configuration of BGA shown in FIG. 17.
Figure 19:
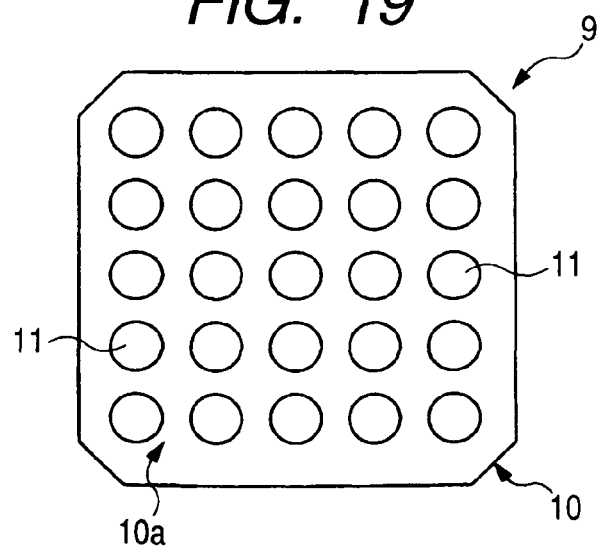
FIG. 19 is a back view showing an example of the configuration of BGA shown in FIG. 17.
Figure 20:
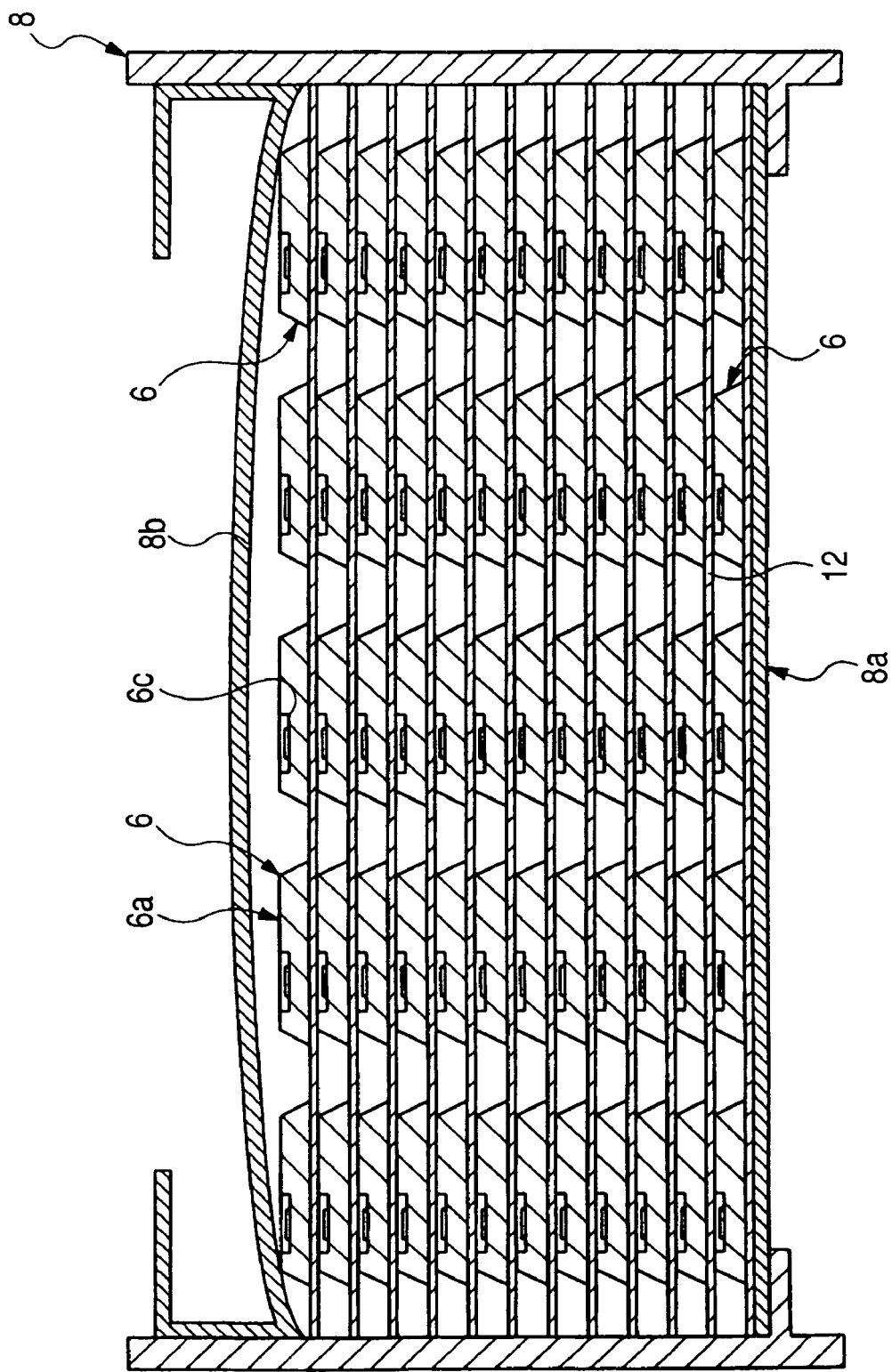
FIG. 20 is a sectional view showing an example of the configuration at the time of the baking treatment after the resin molding in the assembly of BGA shown in FIG. 17.
Figure 21:
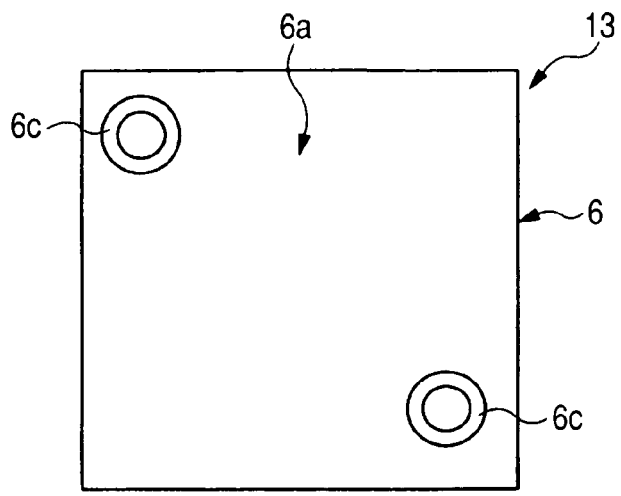
FIG. 21 is a plan view showing the configuration of the batch molding type package which is a semiconductor device of the modification of Embodiment of the invention.
Figure 22:
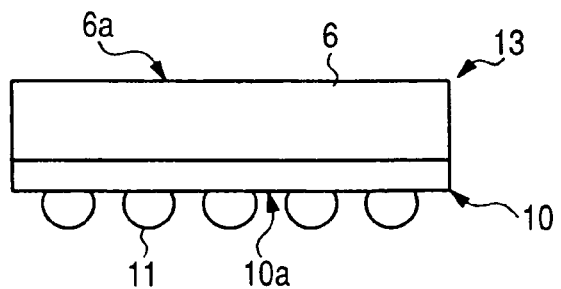
FIG. 22 is a side view showing an example of the configuration of the batch molding type package shown in FIG. 21.
Figure 23:
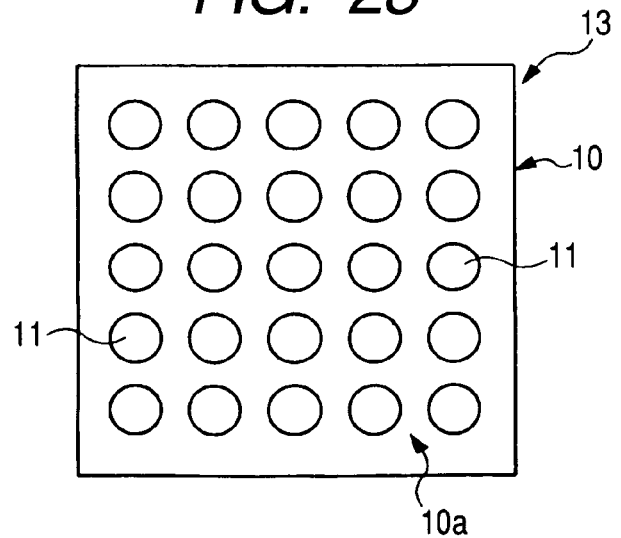
FIG. 23 is a back view showing an example of the configuration of the batch molding type package shown in FIG. 21.
Figure 24:
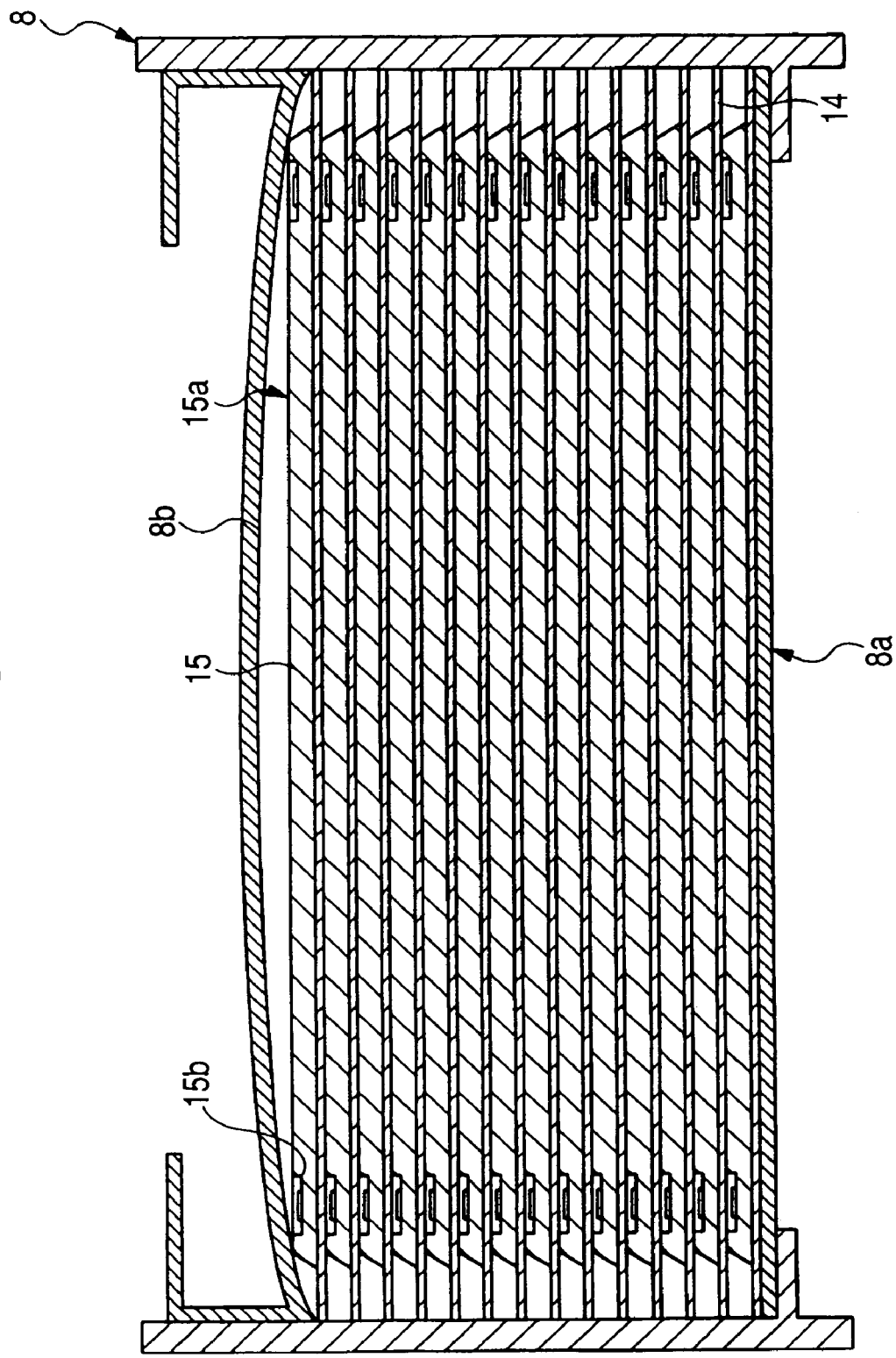
FIG. 24 is a sectional view showing an example of the configuration at the time of the baking treatment after the resin molding in the assembly of the batch molding type package shown in FIG. 21.

FIG. 1 is a plan view showing an example of the configuration of the semiconductor device of Embodiment of the invention; FIG. 2 is a side view showing an example of the configuration of the semiconductor device shown in FIG. 1; FIG. 3 is a back view showing an example of the configuration of the semiconductor device shown in FIG. 1; FIG. 4 is an enlarged partial side view fracturing the part of and showing the configuration of the semiconductor device shown in FIG. 1; FIG. 5 is an enlarged partial sectional view showing the configuration of the A section of FIG. 4; FIG. 6 is a cross-sectional view showing an example of the configuration at the time of the metal-mold clamp in the resin molding step of the assembly of the semiconductor device shown in FIG. 1; FIG. 7 is an enlarged partial sectional view showing the configuration of the B section of FIG. 6; FIG. 8 is a cross-sectional view showing an example of the configuration at the time of the resin injection in the resin molding step of the assembly of the semiconductor device shown in FIG. 1; FIG. 9 is a cross-sectional view showing an example of the configuration at the time of the product extrusion by an ejector pin in the resin molding step of the assembly of the semiconductor device shown in FIG. 1; FIG. 10 is a cross-sectional view fracturing the part of and showing the configuration of the semiconductor device which is shown in FIG. 9, and which was extruded with the ejector pin; FIG. 11 is a sectional view showing an example of the configuration at the time of the baking treatment after resin molding in the assembly of the semiconductor device shown in FIG. 1; FIG. 12 is an enlarged partial sectional view showing the configuration at the time of the water jet in the assembly of the semiconductor device of the modification of Embodiment of the invention; FIG. 13 is a plan view showing the configuration of QFN which is a semiconductor device of the modification of Embodiment of the invention; FIG. 14 is a side view showing an example of the configuration of QFN shown in FIG. 13; FIG. 15 is a back view showing an example of the configuration of QFN shown in FIG. 13; FIG. 16 is a sectional view showing an example of the configuration at the time of the baking treatment after the resin molding in the assembly of QFN shown in FIG. 13; FIG. 17 is a plan view showing the configuration of BGA which is a semiconductor device of the modification of Embodiment of the invention; FIG. 18 is a side view showing an example of the configuration of BGA shown in FIG. 17; FIG. 19 is a back view showing an example of the configuration of BGA shown in FIG. 17; FIG. 20 is a sectional view showing an example of the configuration at the time of the baking treatment after the resin molding in the assembly of BGA shown in FIG. 17; FIG. 21 is a plan view showing the configuration of the batch molding type package which is a semiconductor device of the modification of Embodiment of the invention; FIG. 22 is a side view showing an example of the configuration of the batch molding type package shown in FIG. 21; FIG. 23 is a back view showing an example of the configuration of the batch molding type package shown in FIG. 21; and FIG. 24 is a sectional view showing an example of the configuration at the time of the baking treatment after the resin molding in the assembly of the batch molding type package shown in FIG. 21.

The semiconductor device of Embodiment shown in FIG. 1-FIG. 4 is a semiconductor package of a plastic molded type, and resin molding is performed using resin-molding metal mold 1 shown in FIG. 6 in the assembly, and it is assembled. Therefore, the semiconductor device of Embodiment has molded body 6.

Embodiment takes up and explains QFP (Quad Flat Package) 2 as an example of the semiconductor device.

The structure of QFP 2 shown in FIG. 1 is explained. It comprises semiconductor chip 4 with which the integrated circuit was formed and which is shown in FIG. 6, a plurality of inner leads 3a arranged around semiconductor chip 4, a plurality of outer leads 3b which are external terminals and are connected in one with a plurality of inner leads 3a respectively, a plurality of wires 7 which connect electrically the electrodes of semiconductor chip 4, and inner leads 3a, respectively, such as gold wires, laminated tab 3c connected to semiconductor chip 4, and molded body 6 which performs the resin molding of semiconductor chip 4, a plurality of inner leads 3a and a plurality of wires 7. As shown in FIG. 2 and FIG. 4, depressed portion 6c is formed in surface 6a of molded body 6, and resin burr 6d which withdrew from surface 6a as shown in FIG. 5 is arranged in this depressed portion 6c.

In QFP 2, as shown in FIG. 2 and FIG. 3, depressed portion 6c is formed also in mounting side 6b of molded body 6, and resin burr 6d which withdrew from mounting side 6b is arranged in depressed portion 6c like the surface 6a side.

In QFP 2 of Embodiment, as shown in FIG. 1, four depressed portions 6c are formed in surface 6a of molded body 6, and five depressed portions 6c are further formed in mounting side 6b shown in FIG. 3.

In a resin molding step in the assembly of QFP 2, after resin filling, when picking out a product from resin-molding metal mold 1, resin burr 6d is originated and formed in the clearance formed greatly by abrasion by the sliding operation with a metal mold of ejector pin (pin) 1g which pushes and presses and separates a product from resin-molding metal mold 1 and which is shown in FIG. 6.

That is, in resin-molding metal mold 1, as shown in FIG. 6, the action of ejector pin 1g is also sliding operation with the inner wall of hole parts 1h which guides the action of ejector pin 1g while being the advance-or-retreat moving operation to mold cavity 1d of a metal mold. Therefore, if the sliding operation by ejector pin 1g and the inner wall of hole parts 1h increases, ejector pin 1g, or the inner wall of hole parts 1h will be worn out, and the clearance between this hole part 1h and ejector pin 1g will be formed more greatly.

Therefore, resin burr 6d extends and exists and is formed in the direction parallel to the thickness direction of molded body 6, as shown in FIG. 10.

So, in QFP 2 of Embodiment, projecting portions 1f which project from this bottom face 1e are formed like FIG. 7 in bottom face 1e of mold cavity 1d of resin-molding metal mold 1 corresponding to mounting side 6b and surface 6a of molded body 6 shown in FIG. 6. And by arranging ejector pin 1g so that advance-or-retreat movement may be performed toward mold cavity 1d at this projecting portion 1f, after resin curing, when molded body 6 is extruded and molded body 6 is made to release from resin-molding metal mold 1 with ejector pin 1g, depressed portion 6c is formed in molded body 6 by projecting portion 1f of a metal mold. Thereby, resin burr 6d formed in this depressed portion 6c is made into the condition of having withdrawn from surface 6a (or mounting side 6b) of molded body 6 as shown in FIG. 5.

As a result, when accumulating molded bodies and performing baking treatment in the baking step (heat-treatment for promoting further cure of molded body 6 taken out from resin-molding metal mold 1) after a resin molding step, since resin burr 6d has withdrawn from surface 6a or mounting side 6b of molded body 6, baking treatment can be performed in the condition that the accumulated molded bodies are stuck.

Therefore, the form of deformation of warp etc. of each molded body in a plurality of molded bodies 6 or lead frame (thin plate member) 3 shown in FIG. 11, can be made uniform, and the defect by an uneven package warp can be reduced.

Thereby, improvement in the yield of QFP 2 can be aimed at.

Resin 5 for moldings which forms molded body 6 of QFP 2 is a thermosetting epoxy resin etc., for example. Inner lead 3a, outer lead 3b, and tab 3c are the thin plate materials formed of a copper alloy, ferrous metal, etc., for example. Semiconductor chip 4 includes silicon, for example, and wire 7 is a gold wire further, for example.

A plurality of outer leads 3b which project to four directions from molded body 6 of QFP 2 are bent in the shape of a gull wing, and are fabricated.

Resin-molding metal mold 1 used in the case of resin molding has upper die 1a and lower die 1b, as shown in FIG. 6, and the mold cavity shape corresponding to molded body 6 is formed by mold cavity 1d with which each is provided. Ejector pin 1g which performs advance-or-retreat movement to each mold cavity 1d is formed in upper die 1a and lower die 1b, respectively. In bottom face 1e of each mold cavity 1d, projecting portions 1f which project from this bottom face 1e are formed, and each ejector pin 1g is arranged so that advance-or-retreat movement may be performed toward mold cavity 1d at this projecting portion if.

As shown in FIG. 7, diameter P of ejector pin 1g is P=1.5 mm or P=1.6mm, for example, diameter Q of projecting portion 1f is Q=3.0 mm, for example, and height R of projecting portion 1f is R=50 μm further, for example.

Next, the manufacturing method of the semiconductor device of Embodiment is explained.

First, lead frame 3 (refer to FIG. 6) which is a thin plate member. which has tab 3c being a chip mounting part, a plurality of inner leads 3a arranged to the perimeter, and a plurality of outer leads 3b connected with each inner lead 3a by one, respectively is prepared.

Then, die bonding which fixes semiconductor chip 4 to tab 3c is performed. Here, back surface 4b of semiconductor chip 4 and tab 3c are connected by a die-bonding agent.

Then, wire bonding is performed. Here, the electrode of main surface 4a of semiconductor chip 4, and inner lead 3a corresponding to this are electrically connected with wire 7.

Then, resin molding is performed. First, as shown in FIG. 6, lead frame 3 to which semiconductor chip 4 was mounted and wire bonding was performed is arranged on metal-mold surface 1c which is a mating face of lower die 1b of resin-molding metal mold 1, and resin-molding metal mold 1 is closed after that. That is, as shown in FIG. 8, lead frame 3 to which semiconductor chip 4 was mounted and wire bonding was performed is clamped with lower die 1b and upper die 1a.

Tab 3c, semiconductor chip 4, a plurality of inner leads 3a, and a plurality of wires 7 are arranged at mold cavity 1d formed with lower die 1b and upper die 1a in that case.

Then, resin 5 for moldings is injected into mold cavity 1d of resin-molding metal mold 1, and mold cavity 1d is made to fill up with resin 5 for moldings, as shown in FIG. 8.

After the filling, resin 5 for moldings is cured and molded body 6 is formed. The temperature of resin-molding metal mold 1 at the time of being filled up with resin 5 for moldings and forming molded body 6 is 175° C., for example, and time until it forms molded body 6 is about 1 to 2 minutes, for example.

After forming molded body 6, as shown in FIG. 9, the die opening of lower die 1b and upper die 1a is performed. And surface 6a and mounting side 6b of molded body 6 are pushed and pressed, respectively by ejector pin 1g which performs advance-or-retreat movement toward mold cavity 1d at projecting portion 1f of bottom face 1e of mold cavity id of each of lower die 1b and upper die 1a. Thereby, molded body 6 is extruded from resin-molding metal mold 1, and molded body 6 is made to separate from resin-molding metal mold 1.

Since projecting portions 1f are formed in bottom faces 1e of mold cavity 1d of each of lower die 1b and upper die 1a in that case, as shown in FIG. 10, depressed portions 6c are formed in mounting side 6b and surface 6a of molded body 6, respectively, and resin burrs 6d which withdrew from mounting side 6b or surface 6a are further arranged in each depressed portions 6c of each of mounting side 6b and surface 6a.

Inside resin-molding metal mold 1, since complete cure of the molded body 6 is not performed and it is taken out from resin-molding metal mold 1 in the state of half-cure, the baking step which promotes cure of molded body 6 further after a resin molding step is performed.

Here, lead frames 3 of a plurality of multiple strings with which a plurality of molded bodies 6 were formed in each are stacked in layers with molded bodies 6 themselves piled up, as shown in FIG. 11. And baking treatment is performed in this laminating condition, cure of molded body 6 is promoted further, and complete cure of each molded body 6 is performed. Complete cure here means the thing of the condition that cure of molded body 6 progressed to extent which can maintain reliability sufficient as a product.

In the condition of having stuck molded bodies 6 themselves which adjoin in thickness direction respectively, baking treatment is performed by, for example, 175° C. for about 5 hours to the plurality of molded bodies 6 stacked in layers, in that case.

In a baking step, as shown in FIG. 11, baking treatment is performed using magazine 8 for frames which is a dedicated case for bake. Magazine 8 for frames is provided with sole plate 8a and frame stopper 8b. And in the case of baking treatment, lead frames 3 of a multiple string before individual separation are stacked in layers in piles so that molded bodies 6 themselves may pile up on sole plate 8a. By furthermore arranging frame stopper 8b to the highest rung, baking treatment is performed in the condition that regulation by the load both from the upside and from the underside is imposed on the plurality of molded bodies 6 stacked in layers respectively.

When accumulating molded bodies themselves in a baking step and performing baking treatment in Embodiment, resin burrs 6d formed by ejector pin 1g at the resin molding step are arranged at each depressed portion 6c in the condition of having withdrawn from these surfaces in surface 6a or mounting side 6b of molded body 6, and resin burr 6d projects in neither surface 6a nor mounting side 6b. So, without forming a clearance between mounting side 6b of upper molded body 6, and surface 6a of lower molded body 6, in the condition that the accumulated molded bodies themselves are stuck, baking treatment can be performed.

Thereby, the form of deformation of a warp etc. of each molded body 6 and lead frame 3, can be made uniform.

As a result, the defect by an uneven package warp can be reduced and, thereby, improvement in the yield of QFP 2 can be aimed at.

Since molded body 6 warps easily when QFP 2 is a thin semiconductor device the thickness of which molded body 6 is 1.4 mm or less, for example, it is dramatically effective to perform baking treatment in the condition of having stuck and piled up molded bodies, without making resin burr 6d projecting.

Also in the assembly using lead frame 3 of the multiple string to which matrix arrangement of a plurality of semiconductor device regions was performed, the frame area becomes large, and lead frame 3 warps easily. Therefore, it is dramatically effective to perform baking treatment in the condition of having stuck and piled up molded bodies themselves, without making resin burr 6d project.

Since molded bodies can be accumulated in the condition that resin burr 6d is retracted in depressed portion 6c, it can reduce that a blemish is formed in surface 6a or mounting side 6b of molded body 6. Therefore, improvement in the yield of QFP 2 can be aimed at.

Since improvement in the yield of QFP 2 can be aimed at, the manufacturing cost of a product can be reduced.

Since resin burr 6d changes into the condition of having withdrawn in depressed portion 6c, the defect by an uneven package warp can be reduced. It can reduce that a blemish is formed in surface 6a and mounting side 6b of molded body 6. Therefore, it is not necessary to carry out the removal process of resin burr 6d after a resin molding step. As a result, it becomes possible to shorten TAT (Turn Around Time) of the steps after a resin molding step.

Since the blemish to surface 6a or mounting side 6b of molded body 6 by resin burr 6d can be reduced, the frequency of exchange (maintenance) of ejector pin 1g or resin-molding metal mold 1 can be reduced. Thereby, making long-life of resin-molding metal mold 1 can be attained, and reduction of the manufacturing cost in a resin molding step can be attained.

The clearance formed by abrasion by sliding operation with a metal mold of ejector pin 1g becomes a cause, and resin burr 6d is formed. Therefore, abrasion wear also increases as the number of times of sliding operation of ejector pin 1g increases. As a result, as a long thing, there is also a burr which reaches 100 μm like long burr 6g shown in FIG. 12, for example.

Long burr 6g is formed with, for example, thick burr 6e (resin burr 6d) at the side of a bottom difficult to remove and thin burr 6f at the side of a head easy to remove. As for thick burr 6e, the length is 20-30 μm, for example, and the other part at the side of a head serves as thin burr 6f.

If it is QFP 2 in which molded body 6 is comparatively thick, it can avoid making long burr 6g project from surface 6a or mounting side 6b of molded body 6 by making the depth of depressed portion 6c be more than or equal to 100 μm, when long burr 6g is formed.

However, it is difficult to form in molded body 6 depressed portion 6c that the depth of a depression exceeds 100 μm, furthermore it still more difficult to form in both sides of surface 6a and mounting side 6b of molded body 6, as to thin QFP 2 like the thickness of the molded body 6 is 1.4 mm or less.

Therefore, in the case of thin QFP 2 like the thickness of molded body 6 is 1.4 mm or less, thin burr 6f at the side of a head in long burr 6g can be removed by performing trimming which removes a part or all of long burr 6g after a resin molding step. As an example of the trimming method performed in that case, there is the water jet method which gives hydraulic pressure 16 to long burr 6g using pure water as shown in FIG. 12. Since it becomes only thick burr 6e of 20-30 μm in length by removing thin burr 6f, it can avoid making thick burr 6e project from surface 6a or mounting side 6b of molded body 6 by making the depth of a depression of depressed portion 6c be more than or equal to 50 μm.

That is, in the case of thin QFP 2 like the thickness of molded body 6 is 1.4 μmm or less, it is preferred to make the depth of depressed portion 6c be more than or equal to sufficient depth, for example, 50 μm when storing thick burr 6e whose removal by methods, such as a water jet, is difficult. When long burr 6g of length (for example, the length about 100 μm) longer than the depth of depressed portion 6c is formed in that case, long burr 6g can be made into thick burr 6e of length 20-30 μm by performing trimming by the water jet method etc. after a resin molding step. Thereby, thick burr 6e can be retracted from depressed portion 6c.

In the thin QFP 2 with thickness of molded body 6 being 1.4 mm or less, it is easy to generate a warp (deformation) in molded body 6. Therefore, it can avoid making thick burr 6e in long burr 6g project from surface 6a or mounting side 6b surely by making the depth of depressed portion 6c be more than or equal to 50 μm, and performing trimming by the water jet method etc. after resin molding. Thereby, a big effect can be acquired to deformation of a warp etc.

Also in QFP 2 in which the thickness of molded body 6 exceeds 1.4 mm, when the length of long burr 6g becomes longer than the depth of depressed portion 6c, trimming may be performed after a resin molding step so that a burr may withdraw from depressed portion 6c.

About trimming, not only the water jet method but dry ice cleaning, sandblasting, cleaning, etc. may be adopted. By adopting the water jet method, it is possible to perform trimming making the damage of QFP 2 small.

In the thin QFP 2 with thickness of molded body 6 being 1.4 mm or less, in order to aim at improvement in the filling nature of resin 5 for moldings, resin 5 for moldings of low viscosity is adopted in many cases. Since there is an inclination for still bigger long burr 6g to be formed by resin 5 for moldings of low viscosity, making a burr avoid to project from depressed portion 6c by forming depressed portion 6c in molded body 6 of Embodiment, has a dramatically large effect.

As an example of the conditions of resin 5 for moldings of low viscosity, the particle diameter of the filler contained in resin being about 50 μm and the viscosity of resin may be 100 pois or less in a flow tester viscosity, for example.

Next, the semiconductor device of the modification of Embodiment is explained.

The semiconductor device of the modification shown in FIG. 13-FIG. 15 is QFN (Quad Flat Non-leaded Package) 17 about which a plurality of leads 3d which are external terminals have been arranged in the edge part of mounting side 6b of molded body 6 as shown in FIG. 15. In QFN 17, as shown in FIG. 13, one depressed portion 6c is formed in surface 6a of molded body 6, and resin burr 6d which withdrew from surface 6a as shown in FIG. 5 is arranged in this depressed portion 6c.

Also in the assembly of QFN 17, since, in the baking treatment after a resin molding step, resin burr 6d has withdrawn from surface 6a of molded body 6 when accumulating molded bodies themselves within magazine 8 for frames and performing baking treatment, as shown in FIG. 16, baking treatment can be performed in the condition that the accumulated molded bodies are stuck.

Thereby, the form of deformation of a warp etc. of each molded body in a plurality of molded bodies 6 or lead frame 3, can be made uniform, and the defect by an uneven package warp can be reduced. As a result, improvement in the yield of QFN 17 can be aimed at. Since it is the same as that of the thing of QFP 2 about the other effects acquired by the assembly of QFN 17, the duplication explanation is omitted.

The semiconductor device of the modification shown in FIG. 17-FIG. 19 is BGA (Ball Grid Array) 9 about which a plurality of solder bumps 11 which are external terminals have been arranged in the shape of a grid at the back surface 10a of package substrate 16 while molded body 6 is formed on package substrate 10.

In BGA 9, as shown in FIG. 17, two depressed portions 6c are formed in surface 6a of molded body 6, and resin burr 6d which withdrew from surface 6a as shown in FIG. 5 is arranged in this depressed portion 6c.

In the assembly of BGA 9, the assembly is performed using multi-chip substrate (thin plate member) 12 about which a plurality of semiconductor device regions have been arranged at matrix form and which is shown in FIG. 20. Since multi-chip substrate 12 is also a thin platy member as well as lead frame 3, it is easy to generate deformation of a warp etc. Also in the assembly of BGA 9, in the baking treatment after a resin molding step, as shown in FIG. 20, molded bodies 6 and multi-chip substrates 12 are accumulated within magazine 8 for frames, and baking treatment is performed. Since resin burr 6d has withdrawn from surface 6a of molded body 6 in that case, baking treatment can be performed in the condition that molded bodies 6 and multi-chip substrates 12 which were accumulated are stuck.

Thereby, the form of deformation of a warp etc. of each molded body in a plurality of molded bodies 6 or multi-chip substrate 12, can be made uniform, and the defect by an uneven package warp can be reduced. As a result, improvement in the yield of BGA 9 can be aimed at. Since it is the same as that of the thing of QFP 2 about the other effects acquired by the assembly of BGA 9, the duplication , explanation is omitted.

Like BGA 9 shown in FIG. 17-FIG. 19, the semiconductor device of the modification shown in FIG. 21-FIG. 23 is BGA 13 about which a plurality of solder bumps 11 which are external terminals have been arranged in the shape of a grid at the back surface 10a of package substrate 10 while molded body 6 is formed on package substrate 10.

Also in BGA 13, as shown in FIG. 21, two depressed portions 6c are formed in surface 6a of molded body 6, and resin burr 6d which withdrew from surface 6a as shown in FIG. 5 is arranged in this depressed portion 6c.

BGA 13 uses multi-chip substrate (thin plate member) 14 in the assembly. The batch molding which covers collectively and performs resin molding of a plurality of semiconductor device regions by one mold cavity id (refer to FIG. 6) in the case of resin molding is performed, and as shown in FIG. 24 therefore, batch molded body 15 is formed on multi-chip substrate 14. Although deformation of a warp etc. also tends to generate multi-chip substrate 14 shown in, FIG. 24, since batch molded body 15 by the resin of a big area is further formed on multi-chip substrate 14 in addition, it is very easy to generate deformation of a warp etc.

Also in the assembly of BGA 13, in the baking treatment after a resin molding step, as shown in FIG. 24, batch molded bodies 15 and multi-chip substrates 14 are accumulated within magazine 8 for frames, and baking, treatment is performed. Since resin burr 6d in depressed portion 15b has withdrawn from surface 15a of batch molded body 15 in that case, baking treatment can be performed in the condition that batch molded body 15 and multi-chip substrate 14 which were accumulated are stuck.

Thereby, the form of deformation of a warp etc. of batch molded body 15 or multi-chip substrate 14, can be made uniform, and the defect by an uneven package warp can be reduced. As a result, improvement in the yield of BGA 13 can be aimed at. Since it is the same as that of the thing of QFP 2 about the other effects acquired by the assembly of BGA 13, the duplication explanation is omitted.

As things mentioned above, the present invention accomplished by the present inventors was concretely explained based on an above embodiment of the inventions, but the present invention is not limited by above embodiments of the inventions, and variations and modifications may be made, of course, in various ways in the limit that does not deviate from the gist.

For example, although QFP 2 of Embodiment explained the case where depressed portion 6c was formed in both sides of surface 6a and mounting side 6b of molded body 6, depressed portion 6c does not necessarily need to be formed in mounting side 6b that what is necessary is to just be formed in surface 6a at least.

At least one of depressed portion 6c formed in surface 6a or mounting side 6b should just be formed also in which surface.

The semiconductor device of Embodiment is not limited to QFP 2, QFN 17, BGA 9, and BGA 13. As long as being assembled performing resin molding, they may be other semiconductor devices.

The present invention is suitable for semiconductor manufacturing technology.

What is claimed is:

1. A manufacturing method of a semiconductor device, comprising the steps of:
   (a) providing a plate member having a main surface and a back surface opposing to the main surface, a semiconductor chip having a front surface, an electrode formed on the front surface, and a rear surface opposing to the front surface being mounted on the main surface of the plate member such that the rear surface faces to the main surface, and a wire electrically connecting the electrode with the main surface of the plate member;
   (b) providing a resin-molding metal mold including a first molding die having a first surface, a first cavity formed in the first surface, a first projecting portion formed in the first cavity, a first hole reaching to a first projecting portion surface of the first projecting portion, a first pin arranged inside of the first hole, and a second molding die having a second surface opposing to the first surface, the first pin having an end face closest to the second surface, the end face of the first pin being located in the first hole retracted from the first projecting portion surface;

(c) disposing the plate member between the first molding die and the second molding die such that the semiconductor chip is located inside of the first cavity, and such that the front surface of the semiconductor chip faces to the first cavity;

(d) after the step (c), injecting resin having a filler therein into the first cavity in such a state that the end face of the first pin is retracted from the first projecting portion surface, and forming a molded body sealing the semiconductor chip by curing the resin, wherein in injecting the resin having a filler therein and forming the molded body by curing the resin, in step (d), the end face of the first pin remains retracted from the first projecting portion surface; and (e) after the step (d), separating the molded body from a surface in the first cavity, and removing the plate member on which the molded body is formed from between the first molding die and the second molding die;

wherein in the step (e), the molded body is separated from the surface in the first cavity by pressing the end face of the first pin to a surface of the molded body; and wherein in the step (c), the plate member on which the semiconductor chip is mounted is disposed between the first molding die and the second molding die such that the wire does not contact with the first projecting portion.

2. A manufacturing method of a semiconductor device according to claim 1, wherein after the step (e), a surface of the molded body has a concaved portion and a resin burr, in addition to a main surface portion; and wherein the resin burr is located inside of the concaved portion such that the resin burr is not protruded from the main surface portion of the molded body.

3. A manufacturing method of a semiconductor device according to claim 1, wherein after the step (e), water is sprayed to the surface of the molded body.

4. A manufacturing method of a semiconductor device according to claim 1, wherein the wire has a first part closest to the surface of the first cavity; and wherein in the step (c), the plate member is disposed between the first molding die and the second molding die such that the first part of the wire is not overlapped with the first projecting portion in plan view.

5. A manufacturing method of a semiconductor device according to claim 1, wherein in the step (c) the front surface of the semiconductor chip faces to the first projecting portion.

6. A manufacturing method of a semiconductor device according to claim 1, wherein in the step (e), and after the resin curing in step (d), the first pin performs advance-or-retreat movement toward the first mold cavity to release the mold body from the first cavity.

7. A manufacturing method of a semiconductor device according to claim 1, wherein in the step (e), and after the resin curing in step (d), the end face of the first pin is protruded from the first projecting portion surface by advance-or-retreat movement by the first pin toward the first mold cavity.

8. A manufacturing method of a semiconductor device according to claim 1, wherein after the step (e), the molded body is subjected to further curing.

* * * * *